US010453968B2

United States Patent
Zhang et al.

(10) Patent No.: US 10,453,968 B2
(45) Date of Patent: Oct. 22, 2019

(54) SEMICONDUCTOR DEVICE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hai Yang Zhang, Shanghai (CN); Erhu Zheng, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/994,520

(22) Filed: May 31, 2018

(65) Prior Publication Data
US 2018/0351001 A1    Dec. 6, 2018

(30) Foreign Application Priority Data
Jun. 5, 2017 (CN) .......................... 2017 1 0413163

(51) Int. Cl.
*H01L 29/786* (2006.01)
*H01L 29/423* (2006.01)
(Continued)

(52) U.S. Cl.
CPC ........ *H01L 29/78696* (2013.01); *B82Y 10/00* (2013.01); *H01L 21/265* (2013.01);
(Continued)

(58) Field of Classification Search
CPC .............. H01L 29/8696; H01L 21/265; H01L 21/3065; H01L 29/0673; H01L 29/42392
See application file for complete search history.

(56) References Cited

U.S. PATENT DOCUMENTS 9,735,165 B1* 8/2017 Adusumilli ....... H01L 27/11206
2011/0129978 A1* 6/2011 Cheng .............. H01L 21/26586
438/302
(Continued)

OTHER PUBLICATIONS

Gaben et al., "Stacked Nanowires FETs: Mechanical Robustness Evaluation for sub-7nm Nodes", STMicroelectronics, 2 pages.
Guan et al., "Stress control of plasma enhanced chemical vapor deposited silicon oxide film from tetraethoxysilane", J. Micromech. 24 (2014) 027001, 6 pages.
Kurihara et al., "Gate CD Control Considering Variation of Gate and STI Structure", IEE Transactions on Semiconductor Manufacturing, vol. 20, No. 3, Aug. 2007, 7 pages.
(Continued)

*Primary Examiner* — Zandra V Smith
*Assistant Examiner* — Andre C Stevenson
(74) *Attorney, Agent, or Firm* — Innovation Counsel LLP

(57) ABSTRACT

A semiconductor device and its manufacturing method are presented, relating to semiconductor techniques. The manufacturing method includes: forming a multi-layer structure comprising one or more semiconductor structures on a substrate. The semiconductor structure is formed by: forming a first semiconductor layer; and forming a second semiconductor layer on the first semiconductor layer, wherein in at least one semiconductor structure, an ion implantation is conducted on a portion of the first semiconductor layer to form a doped region therein; etching the multi-layer structure to form a fin structure and a support structure on at least one side of the fin structure, with the support structure comprising at least a portion of the doped region; and removing the first semiconductor layer in the fin structure so that the second semiconductor layer becomes hanging over the substrate. This inventive concept ameliorates the bending issue of the second semiconductor layer.

24 Claims, 9 Drawing Sheets

(51) Int. Cl.
*H01L 21/324* (2006.01)
*H01L 21/3065* (2006.01)
*H01L 21/265* (2006.01)
*H01L 29/06* (2006.01)
*H01L 29/775* (2006.01)
*H01L 29/66* (2006.01)
*B82Y 10/00* (2011.01)

(52) U.S. Cl.
CPC ........ *H01L 21/3065* (2013.01); *H01L 21/324* (2013.01); *H01L 29/0673* (2013.01); *H01L 29/42392* (2013.01); *H01L 29/66439* (2013.01); *H01L 29/66772* (2013.01); *H01L 29/775* (2013.01); *H01L 29/78654* (2013.01)

(56) References Cited

U.S. PATENT DOCUMENTS

| | | | |
|---|---|---|---|
| 2014/0239397 A1* | 8/2014 | Liu | H01L 29/4238 257/347 |
| 2017/0194509 A1* | 7/2017 | Chang | H01L 21/02532 |
| 2018/0233501 A1* | 8/2018 | Balakrishnan | H01L 27/092 |

OTHER PUBLICATIONS

Orlowski et al., "Si SeGe, Ge, and III-V Semiconductor Nanomembranes and Nanowires Enabled by SiGe Epitaxy", ECS Transactions, 33, 2010, 13 pages.

* cited by examiner

SEMICONDUCTOR DEVICE AND MANUFACTURE THEREOF

CROSS-REFERENCE TO RELATED APPLICATION

This application claims priority to and benefit of Chinese Patent Application No. 201710413163.6 filed on Jun. 5, 2017, which is incorporated herein by reference in its entirety.

BACKGROUND

(a) Field of the Invention

This inventive concept relates generally to semiconductor techniques and, more specifically, to a semiconductor device and its manufacturing method. Particularly, it relates to a nanowire and its manufacturing method.

(b) Description of the Related Art

Metal Oxide Semiconductor Field Effect Transistor (MOSFET) with Gate-All-Around (GAA) nanowire provides good electrostatic control and improved charge transfer capability, therefore it is a potential candidate for future semiconductor devices that will have even smaller sizes.

However, conventional nanowire in a semiconductor device is susceptible to bending, which adversely affects the performance of the semiconductor device when the nanowire is used as a channel.

SUMMARY

Based on the investigation to the issues in conventional nanowire, this inventive concept presents an innovative solution that ameliorates the bending issue in conventional nanowire.

This inventive concept first presents a semiconductor manufacturing method, comprising:
forming a multi-layer structure on a substrate, wherein the multi-layer structure comprises one semiconductor structure or a plurality of semiconductor structures stacked on each other, and wherein the semiconductor structure is formed by:
  forming a first semiconductor layer; and
  forming a second semiconductor layer on the first semiconductor layer, wherein in at least one semiconductor structure, an ion implantation process is conducted on a portion of the first semiconductor layer to form a doped region therein;
etching the multi-layer structure to form a fin structure and a support structure, with the support structure at at least one side of the fin structure and comprising at least a portion of the doped region; and
removing the first semiconductor layer in the fin structure so that the second semiconductor layer becomes hanging over the substrate.

Additionally, in the aforementioned method, the second semiconductor layer hanging over the substrate may comprise a nanowire.

Additionally, in the aforementioned method, in at least two semiconductor structures, an ion implantation process may be conducted on a portion of the first semiconductor layer to form a doped region therein.

Additionally, in the aforementioned method, the multi-layer structure may comprise a first region, a second region adjacent to the first region, and a third region adjacent to the second region, and in at least one semiconductor structure, an ion implantation process may be conducted on a portion of the first semiconductor layer in at least one of the first region and the third region to form a doped region therein.

Additionally, in the aforementioned method, etching the multi-layer structure may comprise one of the following four processes:
etching and removing a portion of the second region to form a fin structure, wherein the first region and the third region constitute the support structure, or the first region, the third region, and a portion of the second region outside the fin structure constitute the support structure;
etching and removing a portion of the second region and a portion of the first region adjacent to the second region to form a fin structure, wherein the remaining first region and the third region constitute the support structure;
etching and removing a portion of the second region and a portion of the third region adjacent to the second region to form a fin structure, wherein the remaining third region and the first region constitute the support structure; or
etching and removing a portion of the second region, a portion of the first region adjacent to the second region, and a portion of the third region adjacent to the second region to form a fin structure, wherein the remaining first region and the remaining third region constitute the support structure.

Additionally, in the aforementioned method, the ion implantation process may be conducted under the following conditions:
  a dopant comprising one or more of silicon (Si), carbon (C), nitrogen (N), fluorine (F), and helium (He);
  an implantation energy in a range of 5 KeV to 100 KeV;
  an implantation dose in a range of $1 \times 10^{13}$ atoms/cm$^2$ to $1 \times 10^{15}$ atoms/cm$^2$; and
  an implantation temperature in a range of 100° C. to 800° C.

Additionally, in the aforementioned method, the first semiconductor layer in the fin structure may be removed by a dry etching process and the dry etching process may be conducted under the following conditions:
  a pressure in a range of 5 mTorr to 200 mTorr;
  a power in a range of 100 W to 2000 W;
  a bias voltage in a range of 0 V to 200 V; and
  a source gas comprising one or more of tetrafluoromethane ($CF_4$), oxygen ($O_2$), nitrogen trifluoride ($NF_3$), difluoromethane ($CH_2F_2$) and chlorine ($Cl_2$).

Additionally, in the aforementioned method, a $CF_4$ flow rate may be in a range of 50 sccm to 500 sccm, an $O_2$ flow rate may be in a range of 0 sccm to 100 sccm, a $NF_3$ flow rate may be in a range of 0 sccm to 200 sccm, a $CH_2F_2$ flow rate may be in a range of 0 sccm to 100 sccm, and a $Cl_2$ flow rate may be in a range of 0 sccm to 100 sccm.

Additionally, the aforementioned method may further comprise conducting an annealing treatment after the first semiconductor layer in the fin structure is removed, and the annealing treatment may be conducted under the following conditions:
  an annealing gas comprising nitrogen gas ($N_2$);
  an annealing temperature in a range of 100° C. to 1000° C.; and
  an annealing time in a range of 10 s to 1000 s.

Additionally, in the aforementioned method, the second semiconductor layers in the plurality of the semiconductor structures may have increasing thicknesses from top to bottom, such that the second semiconductor layers become thicker as they get closer to the substrate.

Additionally, in the aforementioned method, the multi-layer structure may further comprise:
a first semiconductor layer on the topmost semiconductor structure,
and removing the first semiconductor layer in the fin structure may further comprise:
removing the topmost first semiconductor layer in the support structure.

Additionally, in the aforementioned method, the first semiconductor layer may comprise silicon-germanium (SiGe), and the second semiconductor layer may comprise silicon (Si), germanium (Ge), or indium gallium arsenide (InGaAs).

This inventive concept further presents a semiconductor device, comprising:
a substrate;
a support structure on the substrate, comprising one semiconducting structure or a plurality of semiconductor structures stacking over each other, wherein the semiconductor structure comprises:
a first semiconductor layer; and
a second semiconductor layer on the first semiconductor layer; and
one or more third semiconductor layers hanging over the substrate, wherein each third semiconductor layer and a corresponding second semiconductor layer in a semiconductor structure constitute a continuous component, and wherein in at least one semiconductor structure, the first semiconductor layer comprises a doped region.

Additionally, in the aforementioned device, the third semiconductor layer may comprise a nanowire, and in two or more semiconductor structures, the first semiconductor layer may comprise a doped region.

Additionally, the aforementioned device may comprise two support structures, wherein the third semiconductor layer and the corresponding second semiconductor layer in each of these two support structures constitute a continuous component.

Additionally, in the aforementioned device, a dopant in the doped region may comprise one or more of silicon (Si), carbon (C), nitrogen (N), fluorine (F), and helium (He).

Additionally, in the aforementioned device, the third semiconductor layers may have monotonically increasing thicknesses from top to bottom.

Additionally, in the aforementioned device, the first semiconductor layer may comprise silicon-germanium (SiGe), the second semiconductor layer may comprise silicon (Si), germanium (Ge), or indium gallium arsenide (InGaAs), and the third semiconductor layer may comprise Si, Ge or InGaAs.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
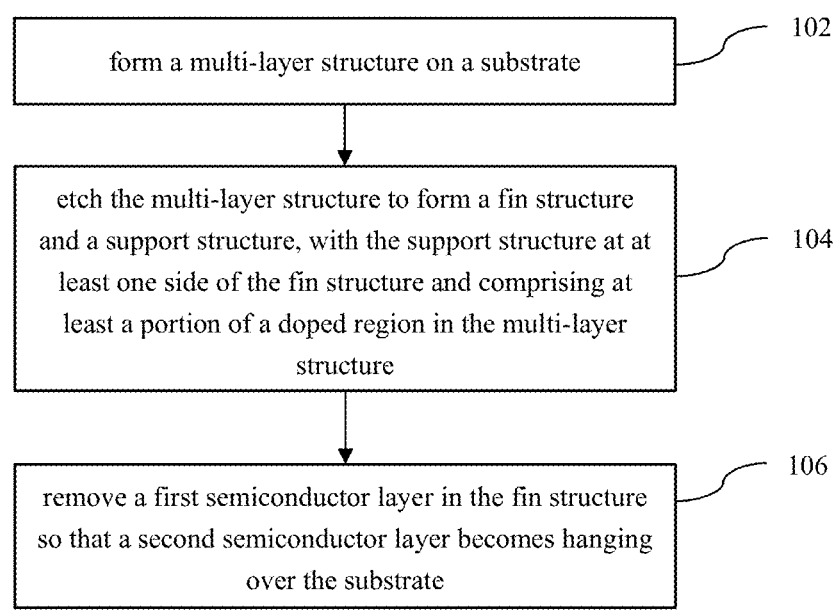
FIG. 1 shows a flowchart illustrating a semiconductor manufacturing method in accordance with one embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in details, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a flowchart illustrating a semiconductor manufacturing method in accordance with one embodiment of this inventive concept. FIGS. 2A, 3A, 4A, 5A, 6A, 7A, and 8A show top plan views illustrating different stages of a semiconductor manufacturing method in accordance with one embodiment of this inventive concept, the corresponding cross-section views of these drawings, observed along line B-B' in these drawings, are shown in FIGS. 2B, 3B, 4B, 5B, 6B, 7B, and 8B, respectively. This semiconductor manufacturing method is described below in details with references to these drawings.

Figure 2A:
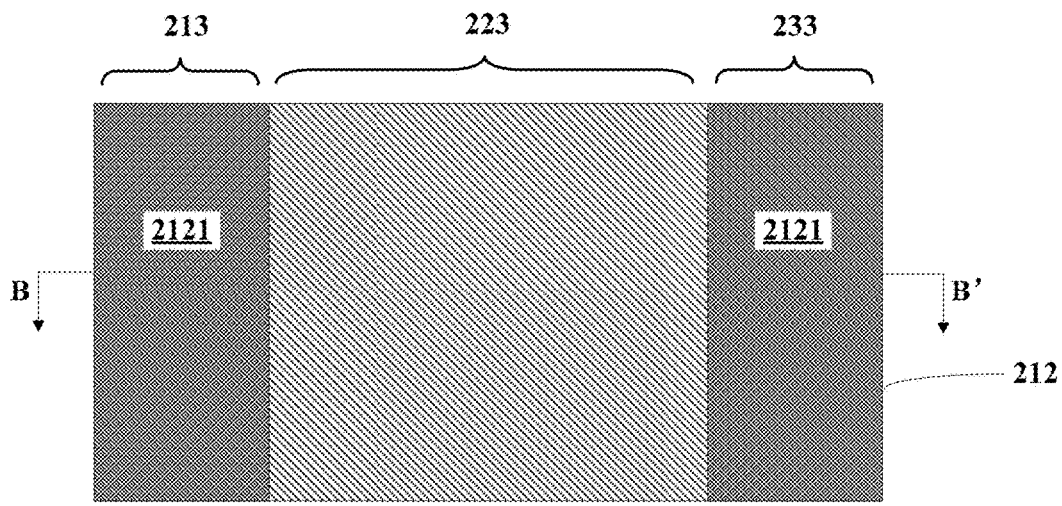
FIG. 2A shows a top plan view of a multi-layer structure in accordance with one embodiment of this inventive concept.
Figure 2B:
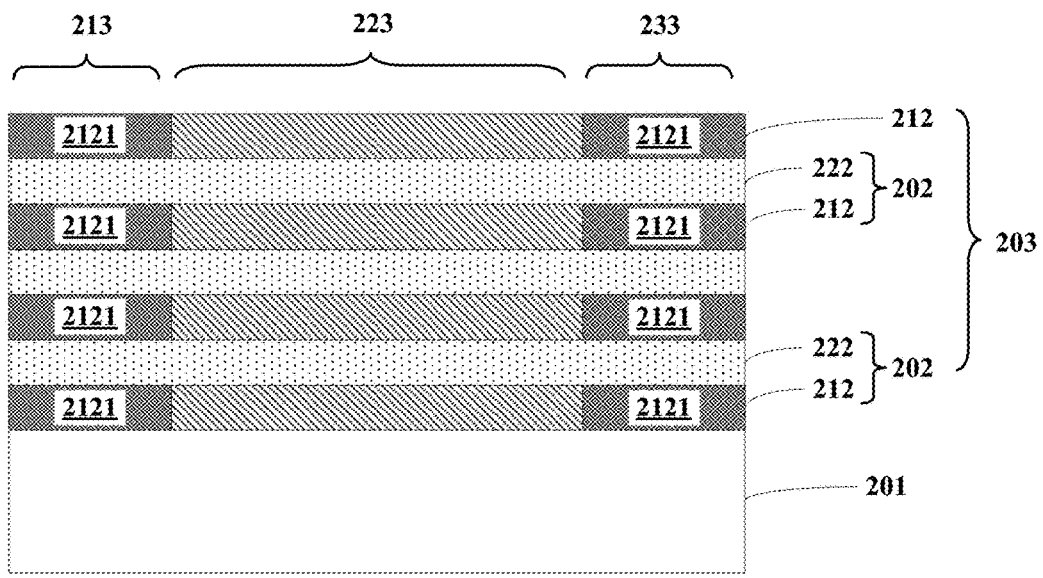
FIG. 2B shows a cross-sectional view of the structure in FIG. 2A, observed along line B-B' in FIG. 2A.

Referring to FIG. 1, in step 102, a multi-layer structure 203 is formed on a substrate 201, as shown in FIGS. 2A and 2B.

The substrate 201 may be a semiconductor substrate such as a silicon substrate or a germanium substrate, the substrate 201 may also be a semiconductor compound substrate such as a gallium arsenide substrate. An oxide layer may be formed on the substrate 201.

The multi-layer structure 203 may comprise one semiconductor structure 202 or a plurality of semiconductor structures 202 stacked on each other (FIG. 2B shows three semiconductor structures 202). Each semiconductor structure 202 may comprise a first semiconductor layer 212 and a second semiconductor layer 222 on the first semiconductor layer 212. Additionally, the multi-layer structure 203 may further comprise a first semiconductor layer 212 on the topmost semiconductor structure 202.

Figure 2C:
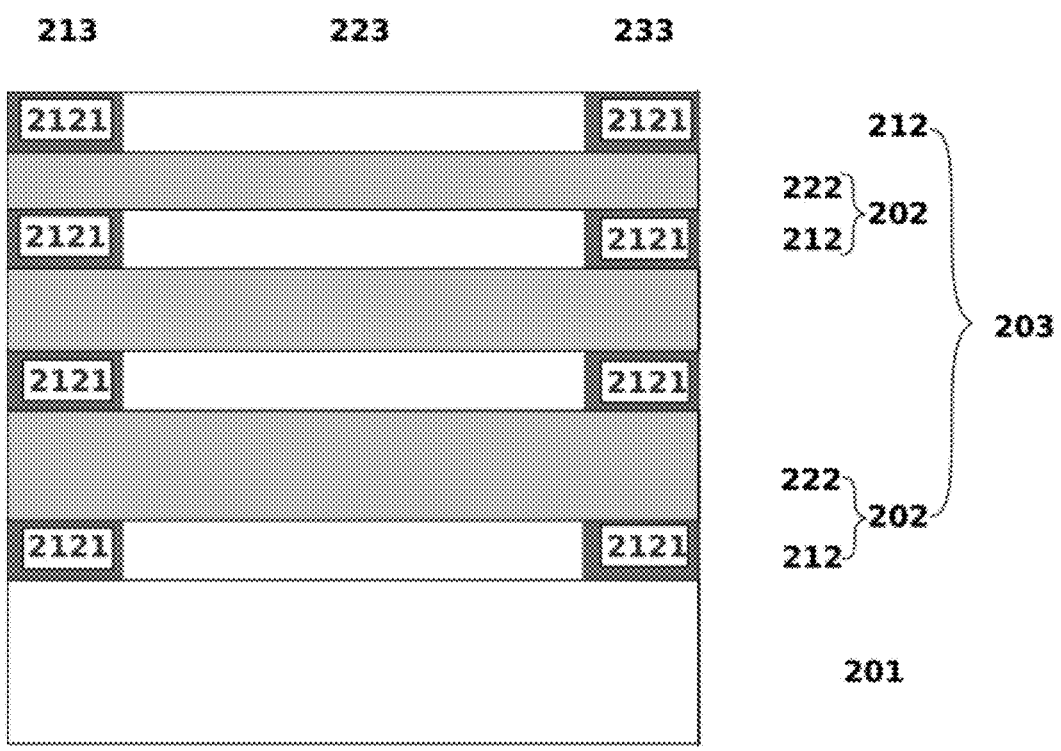
FIG. 2C shows a cross-sectional view of the multi-layer structure wherein the second semiconductor layers vary in thickness.

FIG. 2C illustrates one embodiment in which the second semiconductor layers 222 in the plurality of semiconductor structures 202 have increasing thicknesses from top to bottom, such that the second semiconductor layer 222 becomes thicker with decreasing distance to the substrate 201. This design reduces the resistance of a contact component connecting to the second semiconductor layer 222, which will be formed in a succeeding stage.

Detailed procedures to form a semiconductor structure 202 are described below.

First, a first semiconductor layer 212 is formed. For the first semiconductor structure 202 in the multi-layer structure 203, the first semiconductor layer 212 is formed on the substrate 201; for all other semiconductor structures 202 in the multi-layer structure 203, the first semiconductor layer 212 is formed on the second semiconductor layer 222 in the semiconductor structure 202 beneath this semiconductor structure 202. In one embodiment, the first semiconductor layer 212 may comprise silicon germanium (SiGe).

Next, a second semiconductor layer 222 is formed on the first semiconductor layer 212. In one example, the second semiconductor layer 222 may be epitaxially grown on the first semiconductor layer 212. In one embodiment, the second semiconductor layer 222 may comprise materials such as silicon (Si), germanium (Ge), or indium gallium arsenide (InGaAs).

The method described above may form a multi-layer structure 203 that comprises either one semiconductor structure 202 or a plurality of semiconductor structures 202 stacked over each other on the substrate 201.

During the process to form the multi-layer structure 203, in at least one semiconductor structure 202, an ion implantation process may be conducted on a portion of the first semiconductor layer 212 to form a doped region 2121 therein.

In one example, after a first semiconductor layer 212 has been formed in any one of the plurality of the semiconductor structures 202, an ion implantation process may be conducted on a portion of this first semiconductor layer 212 to form a doped region 2121 therein. In another example, after first semiconductor layers 212 are formed in two or more of the plurality of the semiconductor structures 202, an ion implantation process may be conducted on a portion of these first semiconductor layers 212 to form a doped region 2121 therein. After a first semiconductor layer 212 is formed in each semiconductor structure 202, an ion implantation process is conducted on a portion of these first semiconductor layers 212 to form a doped region 2121 therein, as shown in FIG. 2B.

Next, a process to form the doped region 2121 is described below.

Referring to FIGS. 2A and 2B, in one embodiment, the multi-layer structure 203 may comprise a first region 212, a second region 223 adjacent to the first region 213, and a third region 233 adjacent to the second region 223. After a first semiconductor layer 212 is formed in at least one semiconductor structure 202, an ion implantation process may be conducted on a portion of the first semiconductor layer 212 in at least one of the first region 213 and the third region 233 to form a doped region 2121 therein.

In one example, the ion implantation process may be conducted only on a portion of the first semiconductor layer 212 in the first region 213 to form a doped region 2121. In another example, the ion implantation process may be conducted only on a portion of the first semiconductor layer 212 in the third region 213 to form a doped region 2121. In yet another example, the ion implantation process may be conducted on a portion of the first semiconductor layer 212 in both the first region 213 and the third region 233 to form a doped region 2121, as shown in FIGS. 2A and 2B.

It should be understood that the first region 213, the second region 223, and the third region 233 of the multi-layer structure 203 do not have to be arranged along line B-B' in FIG. 2A, the first region 213, the second region 223, and the third region 233 may be arranged along any direction. In one example, when a patterned hard mask layer (e.g., a photoresist) is formed on the multi-layer structure 203, the portion of the multi-layer structure 203 that is covered by the hard mask layer may be designated as the second region 223, and other portions of the multi-layer structure 203 that are not covered by the hard mask layer may be designated as the first region 213 or the third region 233. The second region 223 may be longer than the first region 212 and the third region 233 along a direction parallel with an upper surface of the substrate 201.

The ion implantation process to form the doped region 2121 may be conducted under the following conditions: a dopant may comprise one or more of silicon (Si), carbon (C), nitrogen (N), fluorine (F), and helium (He); an implantation energy may be in a range of 5 KeV to 100 KeV (e.g., 10 KeV, 30 KeV, or 60 KeV); an implantation does may be in a range of $1\times10^{13}$ atoms/cm$^2$ to $1\times10^{15}$ atoms/cm$^2$ (e.g., $1\times10^{13}$ atoms/cm$^2$, $5\times10^{13}$ atoms/cm$^2$, $1\times10^{14}$ atoms/cm$^2$, or $5\times10^{14}$ atoms/cm$^2$); and an implantation temperature may be in a range of 100° C. to 800° C. (e.g., 300° C., 500° C., or 600° C.).

Back to FIG. 1, in step 104, the multi-layer structure 203 is etched to form a fin structure 301 and a support structure 302 on at least one side of the fin structure 301. The support structure 302 may comprise at least a portion of the doped region 2121. In one example, a patterned hard mask layer (e.g., a photoresist) may first be formed on the multi-layer structure 203 to define the sizes and locations of the fin structure 301 and the support structure 302, then the multi-layer structure 203 may be etched with respect to the hard mask layer to form the fin structure 301 and the support structure 302.

In one embodiment, the multi-layer structure 203 may comprise the first region 213, the second region 223, and the third region 233. In that case, several different schemes may be used to etch the multi-layer structure 203 to form the fin structure 301 and the support structure 302. In these schemes, different hard mask layers may be formed to define the sizes and locations of the fin structure 301 and the support structure 302, these schemes are described in details below.

Figure 3A:
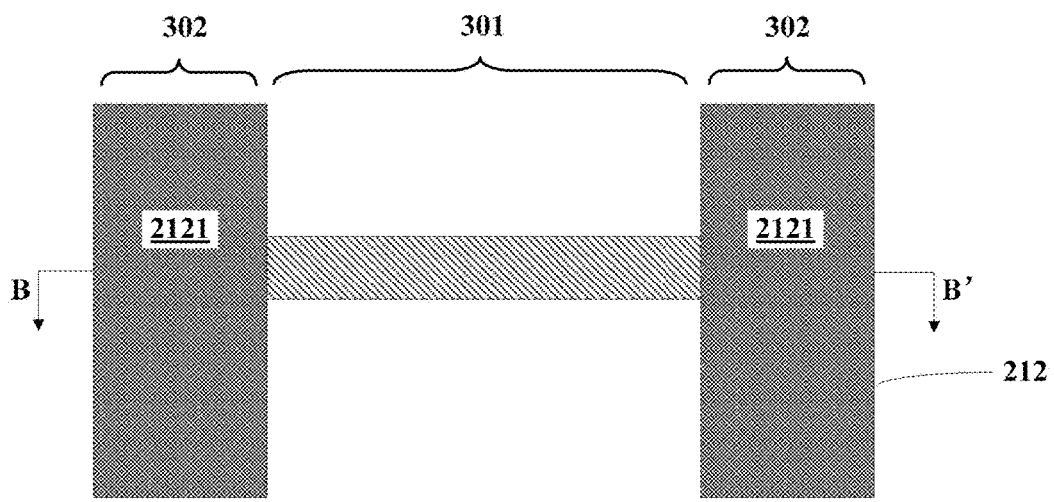
FIG. 3A shows a top plan view of a multi-layer structure after a first etching scheme in accordance with one embodiment of this inventive concept.
Figure 3B:
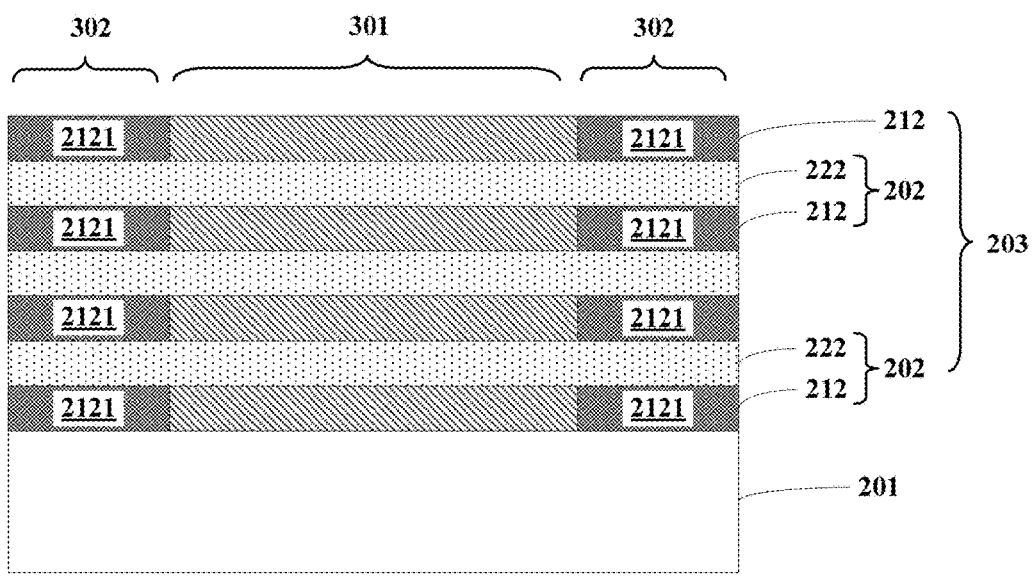
FIG. 3B shows a cross-section view of the structure in FIG. 3A, observed along line B-B' in FIG. 3A.

Referring to FIGS. 3A and 3B, in a first scheme, a portion of the second region 223 may be removed by etching the multi-layer structure 203 to form the fin structure 301. In this scheme, the first region 213 and the third region 233 may constitute the support structure 302, and the support structure 302 may comprise the entire doped region 2121.

Figure 4A:
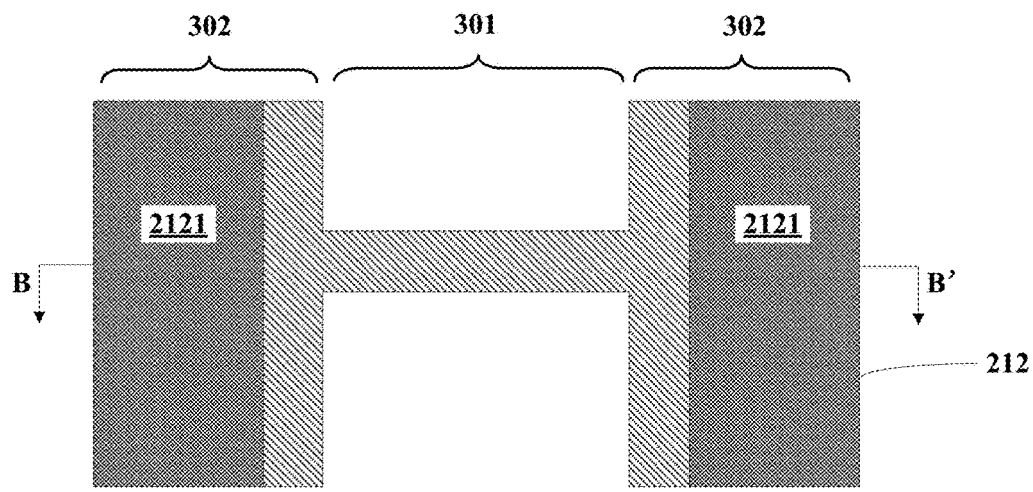
FIG. 4A shows a top plan view of a multi-layer structure after a second etching scheme in accordance with one embodiment of this inventive concept.
Figure 4B:
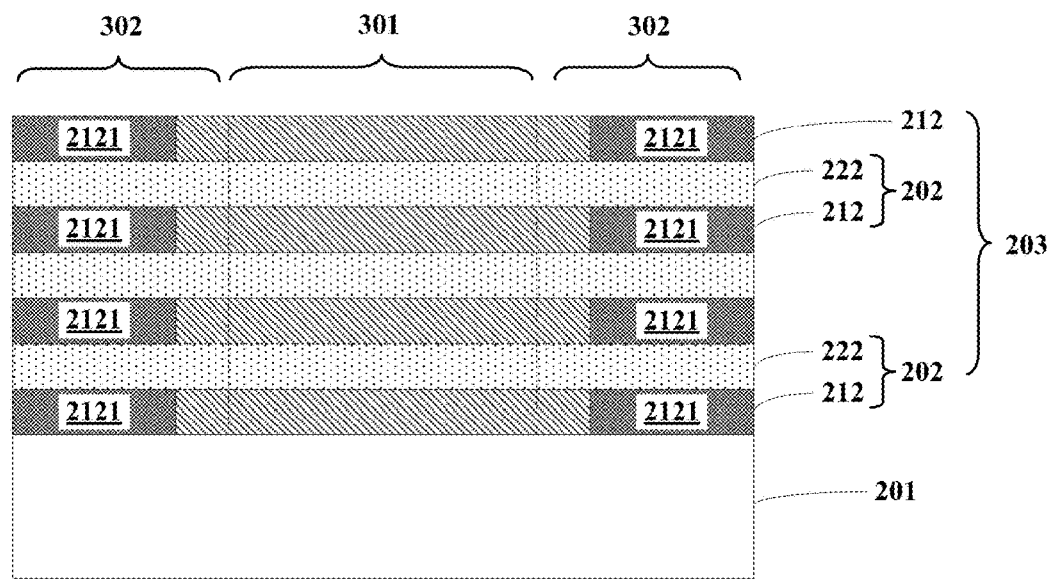
FIG. 4B shows a cross-section view of the structure in FIG. 4A, observed along line B-B' in FIG. 4A.

Referring to FIGS. 4A and 4B, in a second scheme, a portion of the second region 223 may be removed by etching the multi-layer structure 203 to form the fin structure 301. In this scheme, the remaining second region 223 outside the fin structure 301, the first region 213, and the third region 233 may constitute the support structure 302, and the support structure 302 may comprise the entire doped region 2121.

Figure 5A:
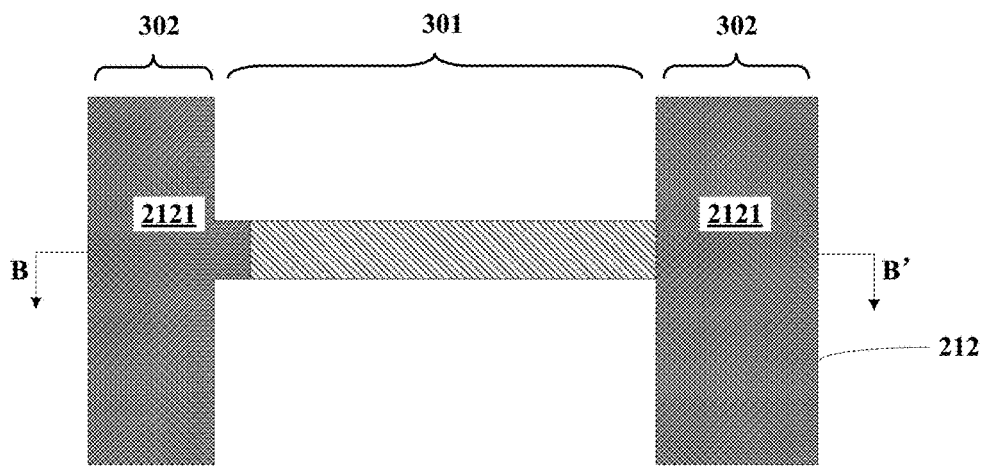
FIG. 5A shows a top plan view of a multi-layer structure after a third etching scheme in accordance with one embodiment of this inventive concept.
Figure 5B:
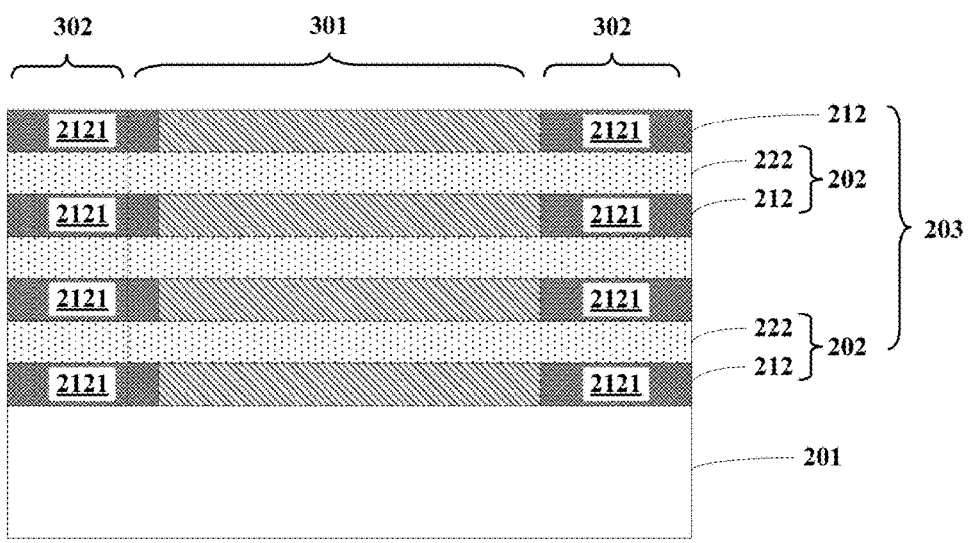
FIG. 5B shows a cross-section view of the structure in FIG. 5A, observed along line B-B' in FIG. 5A.

Referring to FIGS. 5A and 5B, in a third scheme, a portion of the second region 223 and a portion of the first region 213 adjacent to the second region 223 may be removed by etching the multi-layer structure 203 to form the fin structure 301. In this scheme, the remaining first region 213 and the third region 233 may constitute the support structure 302, and the support structure 302 may comprise a portion of the doped region 2121.

Figure 6A:
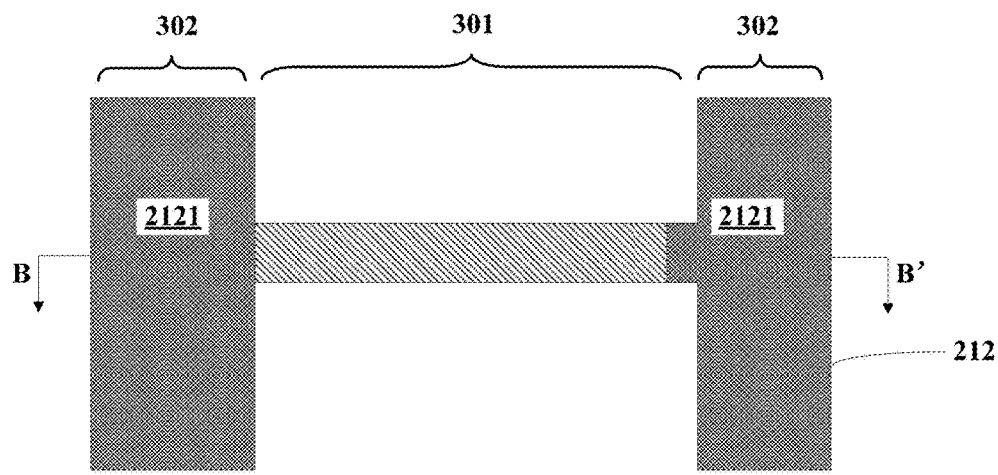
FIG. 6A shows a top plan view of a multi-layer structure after a fourth etching scheme in accordance with one embodiment of this inventive concept.
Figure 6B:
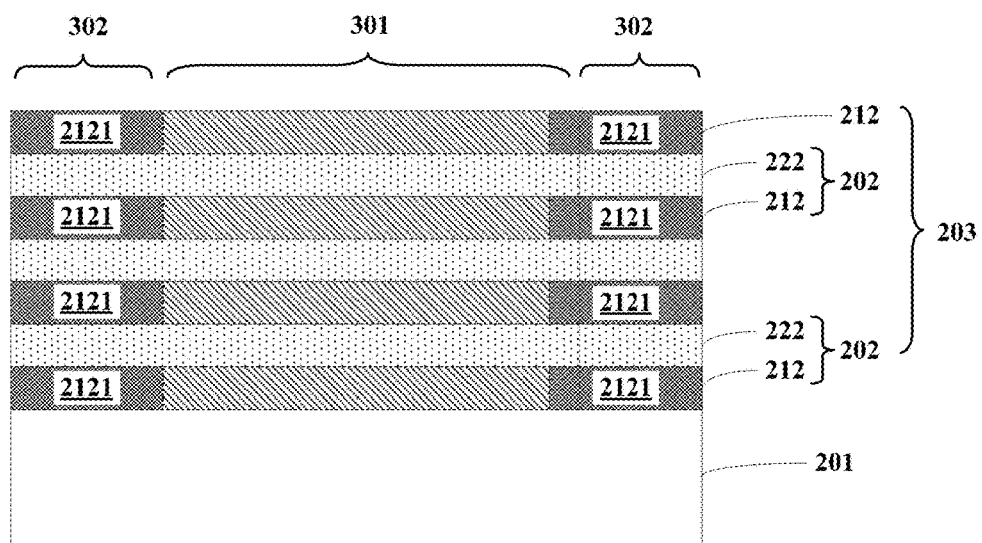
FIG. 6B shows a cross-sectional view of the structure in FIG. 6A, observed along line B-B' in FIG. 6A.

Referring to FIGS. 6A and 6B, in a fourth scheme, a portion of the second region 223 and a portion of the third region 233 adjacent to the second region 223 may be removed by etching the multi-layer structure 203 to form the fin structure 301. In this scheme, the first region 213 and the remaining third region 233 may constitute the support structure 302, and the support structure 302 may comprise a portion of the doped region 2121.

Figure 7A:
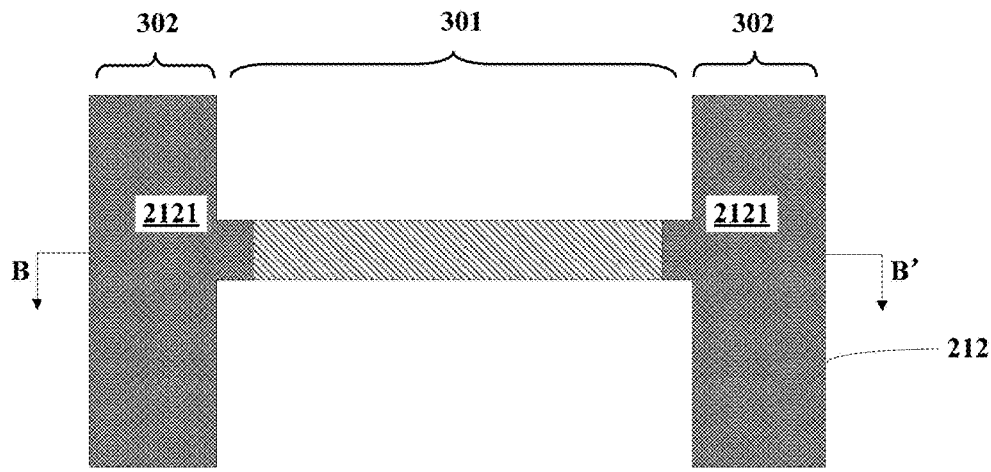
FIG. 7A shows a top plan view of a multi-layer structure after a fifth etching scheme in accordance with one embodiment of this inventive concept.
Figure 7B:
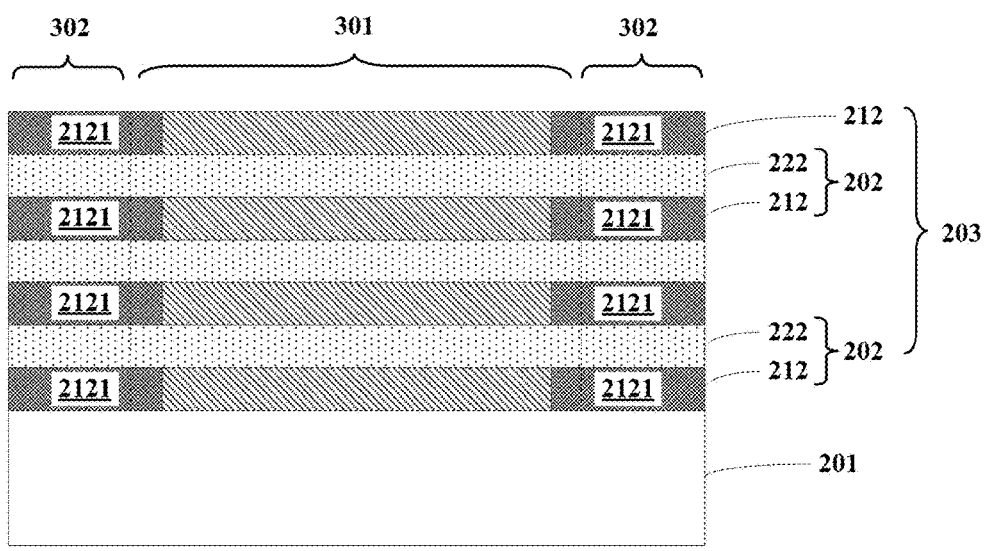
FIG. 7B shows a cross-sectional view of the structure in FIG. 7A, observed along line B-B' in FIG. 7A.

Referring to FIGS. 7A and 7B, in a fifth scheme, a portion of the second region 223, a portion of the first region 213 adjacent to the second region 223, and a portion of the third region 233 adjacent to the second region 223 may be removed by etching the multi-layer structure 203 to form the fin structure 301. In this scheme, the remaining first region 213 and the remaining third region 233 may constitute the support structure 302, and the support structure 302 may comprise a portion of the doped region 2121.

The steps after formation of the fin structure 301 and the support structure 302 are described below using FIGS. 3A and 3B as an example.

Figure 8A:
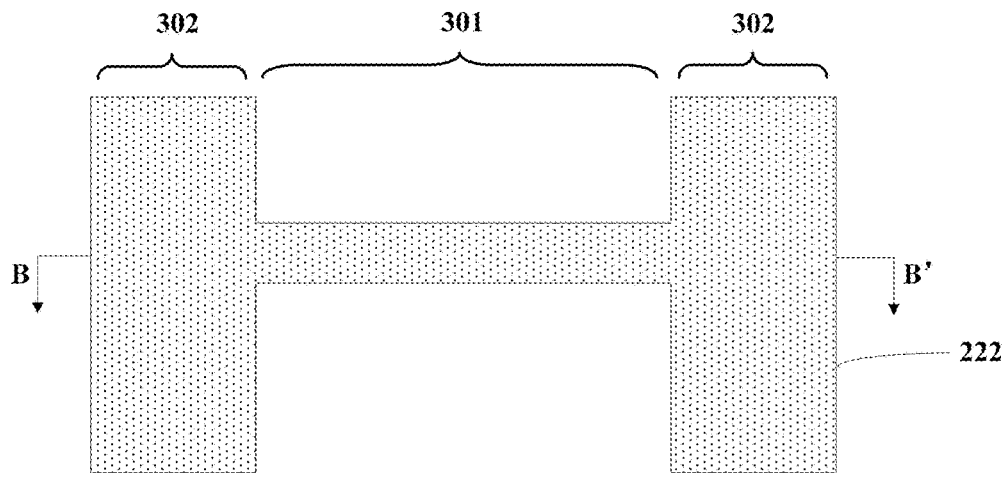
FIG. 8A shows a top plan view of a multi-layer structure after first semiconductor layers in a fin structure are removed in accordance with one embodiment of this inventive concept.
Figure 8B:
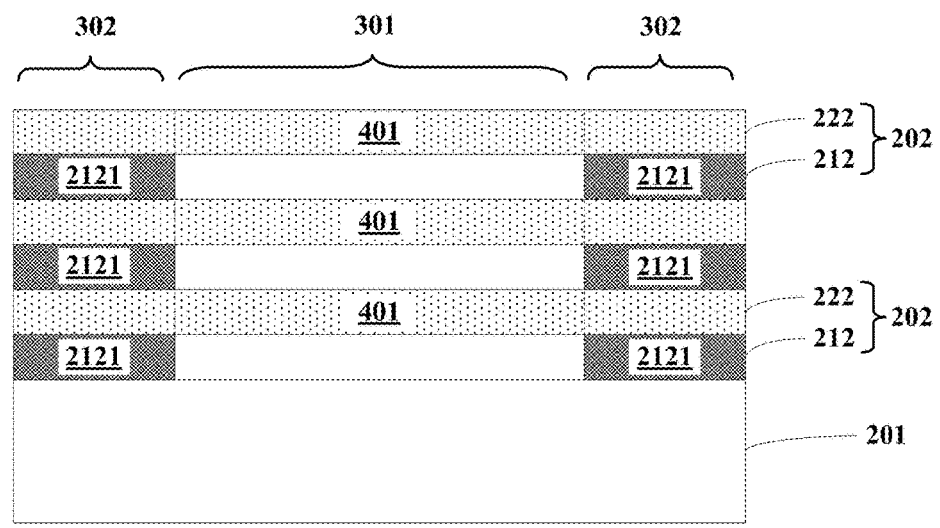
FIG. 8B shows a cross-section view of the structure in FIG. 8A, observed along line B-B' in FIG. 8A.

In step 106, the first semiconductor layers 212 in the fin structure 301 are selectively removed, while the second semiconductor layers 222 in the fin structure 301 are retained, so that a portion of the second semiconductor layer 401 hangs over the substrate 201, as shown in FIGS. 8A and 8B. The portion of the second semiconductor layer 401 hanging over the substrate 201 is the second semiconductor layer 222 in the fin structure 310, this portion of the second semiconductor layer may also be designated as a third semiconductor layer in the rest of this application. In one embodiment, the second semiconductor layer 401 hanging over the substrate 201 may comprise a nanowire.

It should be noted that when the multi-layer structure 203 comprises a first semiconductor layer 212 on the topmost semiconductor structure 202, step 106 may further comprise removing the topmost first semiconductor layer 212 in the support structure 302.

Additionally, when the first semiconductor layers 212 in the fin structure 301 are selectively removed, a portion of the first semiconductor layers 212 in the support structure 302 may also be removed; this, however, will not affect its supportive function to the second semiconductor layer 222.

In one embodiment, the first semiconductor layers 212 in the fin structure 301 may be removed by a dry etching process such as an ion beam etching process, and an etchant that has a higher selectivity ratio to the second semiconductor layer 222 than the first semiconductor layer 212 may be used in the etching process.

The dry etching process may be conducted under the following conditions: a pressure in a range of 5 mTorr to 200 mTorr (e.g., 50 mTorr, 100 mTorr, 150 mTorr); a power in a range of 100 W to 2000 W (e.g., 500 W, 1000 W, 1500 W); a bias voltage in a range of 0 V to 200 V (e.g., 30 V, 80 V, 150 V); and a source gas comprising one or more of tetrafluoromethane ($CF_4$), oxygen ($O_2$), nitrogen trifluoride ($NF_3$), difluoromethane ($CH_2F_2$) and chlorine ($Cl_2$).

In the dry etching process, a $CF_4$ flow rate may be in a range of 50 sccm to 500 sccm (e.g., 100 sccm, 200 sccm, 400 sccm), an $O_2$ flow rate may be in a range of 0 sccm to 100 sccm (e.g., 30 sccm, 50 sccm, 80 sccm), a $NF_3$ flow rate may be in a range of 0 sccm to 200 sccm (e.g., 50 sccm, 100 sccm), a $CH_2F_2$ flow rate may be in a range of 0 sccm to 100 sccm (e.g., 20 sccm, 50 sccm, 80 sccm), and a $Cl_2$ flow rate may be in a range of 0 sccm to 100 sccm (20 sccm, 50 sccm, 80 sccm).

Figure 9:
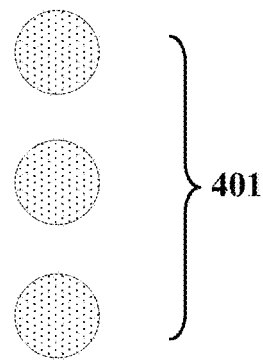
FIG. 9 shows a cross-sectional view of second semiconductor layers after an annealing treatment in accordance with one embodiment of this inventive concept.

After the first semiconductor layer 212 in the fin structure 301 is removed, an annealing treatment may be conducted to apply a chamfering process on the second semiconductor layer 222 in the fin structure 301, so that the second semiconductor layer 222 has an approximately circular cross-section, as shown in FIG. 9. The annealing treatment may be conducted under the following conditions: an annealing gas comprising nitrogen gas ($N_2$); an annealing temperature in a range of 100° C. to 1000° C. (e.g., 300° C., 500° C., 800° C.); and an annealing time in a range of 10 s to 1000 s (e.g., 50 s, 200 s, 500 s).

After the second semiconductor layer 401 becomes hanging over the substrate the substrate 201, a gate structure surrounding the second semiconductor layer 401 may be formed. The gate structure may comprise a gate dielectric layer surrounding the second semiconductor layer 401 and a gate. The portion of the second semiconductor layer 401 that is surrounded by the gate structure may work as a channel. Additionally, a source region and a drain region may respectively be formed at a side of the gate structure in the second semiconductor layer 401.

This concludes the description of a semiconductor device manufacturing method in accordance with one embodiment of this inventive concept. In this manufacturing method, by conducting an ion implantation process, a doped region is formed in a portion of the first semiconductor layer in at least one semiconductor structure, therefore the intrinsic stress in the first semiconductor layer may be reduced after the support structure is formed, this helps to ameliorate the bending issue of the second semiconductor layer hanging over the substrate.

This inventive concept further presents a semiconductor device. As shown in FIGS. 8A and 8B, the semiconductor device comprises a substrate 201 and a support structure 302 on the substrate 201. The support structure 302 may comprise one semiconductor structure 202 or a plurality of semiconductor structures 202 stacked on each other. Each semiconductor structure 202 comprises a first semiconductor layer 212 and a second semiconductor layer 222 on the first semiconductor layer 212. The first semiconductor layer may comprise silicon germanium (SiGe), and the second semiconductor layer 222 may comprise materials such as silicon (Si), germanium (Ge), or indium gallium arsenide (InGaAs).

The semiconductor device may further comprise a third semiconductor layer 401 hanging over the substrate 201, or a plurality of third semiconductor layers 401 vertically stacked on each other and hanging over the substrate 201, the third semiconductor layer 401 and the second semiconductor layer 222 in the semiconductor structure 202 constitute a continuous component. The plurality of the third semiconductor layers 401 may have monotonically increasing thicknesses from top to bottom. In one embodiment, the third semiconductor layer 401 may comprise materials such as silicon (Si), germanium (Ge), or indium gallium arsenide (InGaAs). In one embodiment, the third semiconductor layer 401 may comprise a nanowire.

In the semiconductor device described above, in at least one semiconductor layer 202, the first semiconductor layer 212 comprises a doped region 2121. In two or more semiconductor structures 202, the first semiconductor layer 212 may comprise a doped region 2121. Ideally, in each semiconductor layer 202, the first semiconductor layer 212 comprises a doped region 2121. The dopant in the doped region 2121 may comprise one or more of silicon (Si), carbon (C), nitrogen (N), fluorine (F), and helium (He).

In one embodiment, the semiconductor device may comprise two support structures 302. In that case, each third semiconductor layer 401 and the corresponding second semiconductor layer 222 in each of the support structures 302 constitute a continuous component.

This concludes the description of a semiconductor device and its manufacturing method in accordance with one or more embodiments of this inventive concept. For purposes of conciseness and convenience, some components or procedures that are well known to one of ordinary skills in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device manufacturing method, comprising:
   forming a multi-layer structure on a substrate, wherein the multi-layer structure comprises
   a first semiconductor layer on a face of the substrate and comprises
   a second semiconductor layer on the first semiconductor layer, and wherein an ion implantation process is conducted on the first semiconductor layer to form a first doped region, a second doped region, and a first semiconductor region between the first doped region and the second doped region;
   and
   removing the first semiconductor region to form a cavity, wherein the cavity is positioned between the first doped region and the second doped region in a first direction parallel to the face of the substrate, wherein the second semiconductor layer continuously extends in the first direction from the first doped region to the second region portion, and wherein each of the cavity, the first doped region, and the second doped region is positioned between the second semiconductor layer and the substrate in a second direction perpendicular to the first direction.

2. The method of claim 1, wherein the second semiconductor layer the substrate comprises a nanowire.

3. The method of claim 1, comprising: removing a second semiconductor region, wherein the ion implantation process is conducted on the first semiconductor layer and a third semiconductor layer to form the first doped region, the second doped region, a third doped region, and a fourth doped region, wherein the second semiconductor portion is positioned between the third doped region and the fourth doped region before being removed, wherein the second semiconductor layer is positioned between the first doped region and the third doped region and is positioned between the second doped region and the fourth doped region.

4. The method of claim 1, wherein the multi-layer structure comprises a first region, a second region adjacent to the first region, and a third region adjacent to the second region, and wherein the ion implantation process is conducted in at least one of the first region and the third region.

5. The method of claim 4, comprising:
   etching the multi-layer structure and removing a portion of the second region to form a fin structure, wherein the first region and the third region constitute a support structure, or the first region, the third region, and a portion of the second region outside the fin structure constitute the support structure.

6. The method of claim 4, wherein etching the multi-layer structure comprises:
   etching and removing a portion of the second region and a portion of the first region adjacent to the second region to form a fin structure, wherein the remaining portions of the first region and the third region constitute the support structure.

7. The method of claim 4, wherein etching the multi-layer structure comprises:
   etching and removing a portion of the second region and a portion of the third region adjacent to the second region to form a fin structure, wherein the remaining portions of the third region and the first region constitute the support structure.

8. The method of claim 4, wherein etching the multi-layer structure comprises:
   etching and removing a portion of the second region, a portion of the first region adjacent to the second region, and a portion of the third region adjacent to the second region to form a fin structure, wherein the remaining first region and the remaining third region constitute the support structure.

9. The method of claim 1, wherein the ion implantation process is conducted under the following conditions:
   a dopant comprising one or more of silicon (Si), carbon (C), nitrogen (N), fluorine (F), and helium (He);
   an implantation energy in a range of 5 KeV to 100 KeV;
   an implantation dose in a range of $1 \times 10^{13}$ atoms/cm$^2$ to $1 \times 10^{15}$ atoms/cm$^2$; and
   an implantation temperature in a range of 100° C. to 800° C.

10. The method of claim 1, wherein the first semiconductor layer in the fin structure is removed by a dry etching process.

11. The method of claim 10, wherein the dry etching process is conducted under the following conditions:
    a pressure in a range of 5 mTorr to 200 mTorr;
    a power in a range of 100 W to 2000 W;
    a bias voltage in a range of 0 V to 200 V; and
    a source gas comprising one or more of tetrafluoromethane (CF$_4$), oxygen (O$_2$), nitrogen trifluoride (NF$_3$), difluoromethane (CH$_2$F$_2$) and chlorine (Cl$_2$).

12. The method of claim 11, wherein a CF$_4$ flow rate is in a range of 50 sccm to 500 sccm, an O$_2$ flow rate is in a range of 0 sccm to 100 sccm, a NF$_3$ flow rate is in a range of 0 sccm to 200 sccm, a CH$_2$F$_2$ flow rate is in a range of 0 sccm to 100 sccm, and a Cl$_2$ flow rate is in a range of 0 sccm to 100 sccm.

13. The method of claim 1, further comprising conducting an annealing treatment after the first semiconductor layer in the fin structure is removed.

14. The method of claim 13, wherein the annealing treatment is conducted under the following conditions:
    an annealing gas comprising nitrogen gas (N$_2$);
    an annealing temperature in a range of 100° C. to 1000° C.; and
    an annealing time in a range of 10 s to 1000 s.

15. The method of claim 1, wherein the second semiconductor layers in the plurality of the semiconductor structures have monotonically increasing thicknesses from top to bottom.

16. The method of claim 1, wherein the multi-layer structure further comprises:
    a first semiconductor layer on the topmost semiconductor structure,
    and wherein removing the first semiconductor layer in the fin structure further comprises:
    removing the topmost first semiconductor layer in the support structure.

17. The method of claim 1, wherein the first semiconductor layer comprises silicon-germanium (SiGe), and the second semiconductor layer comprises silicon (Si), germanium (Ge), or indium gallium arsenide (InGaAs).

18. A semiconductor device, comprising:
a substrate;
   a first semiconductor layer positioned on a face of the substrate and comprising a first doped region and a second doped region, wherein a cavity is positioned between the first doped region and the second doped region in a first direction parallel to the face of the substrate; and
   a second semiconductor layer continuously extending in the first direction from the first doped region to the second doped region, wherein each of the cavity, the first doped region, and the second doped region is positioned between the second semiconductor layer and the substrate in a direction perpendicular to the first direction.

19. The device of claim 18, wherein the third second semiconductor layer comprises a nanowire.

20. The device of claim 18, further comprising: a third doped region; and a fourth doped region spaced from the third doped region, wherein the second semiconductor layer is positioned between the first doped region and the third doped region, is positioned between the second doped region and the fourth doped region, and directly contacts each of the first doped region, the second doped region, the third doped region, and the fourth doped region.

21. The device of claim 18, wherein the second semiconductor layer constitutes a continuous component.

22. The device of claim 18, wherein a dopant in the first doped region comprises one or more of silicon (Si), carbon (C), nitrogen (N), fluorine (F), and helium (He).

23. The device of claim 20, further comprising: a third semiconductor layer continuous extending from the third doped region to the fourth doped region and spaced from the second semiconductor layer, wherein the second semiconductor layer is positioned between the substrate and the third semiconductor layer and is thicker than or as equal as the third semiconductor layer.

24. The device of claim 23, wherein the first semiconductor layer comprises silicon-germanium (SiGe), the second semiconductor layer comprises silicon (Si), germanium (Ge), or indium gallium arsenide (InGaAs), and the third semiconductor layer comprises Si, Ge or InGaAs.

* * * * *